(12) United States Patent
Tosaya et al.

(10) Patent No.: US 6,483,169 B1
(45) Date of Patent: Nov. 19, 2002

(54) EXTRUDED HEAT SPREADER

(75) Inventors: Eric S. Tosaya, Fremont, CA (US); Edward S. Alcid, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/892,777

(22) Filed: Jun. 28, 2001

Related U.S. Application Data

(60) Provisional application No. 60/214,785, filed on Jun. 28, 2000.

(51) Int. Cl.[7] .................................................. H01L 31/11
(52) U.S. Cl. ....................................... 257/565; 257/722
(58) Field of Search ................................. 257/565, 722, 257/706; 174/52.4; 361/704, 707; 72/256

(56) References Cited

U.S. PATENT DOCUMENTS

| | | | | |
|---|---|---|---|---|
| 5,754,402 A | * | 5/1998 | Matsuzaki et al. | 361/707 |
| 5,930,114 A | * | 7/1999 | Kuzmin et al. | 361/704 |
| 6,114,761 A | * | 9/2000 | Mertol et al. | 257/722 |
| 6,118,177 A | * | 9/2000 | Lischner et al. | 257/706 |
| 6,191,360 B1 | * | 2/2001 | Tao et al. | 174/52.4 |
| 6,219,238 B1 | * | 4/2001 | Andros et al. | 361/704 |
| 6,219,243 B1 | * | 4/2001 | Ma et al. | 361/704 |
| 6,250,127 B1 | * | 6/2001 | Polese et al. | 72/256 |

\* cited by examiner

Primary Examiner—David Nelms
Assistant Examiner—Thinh Nguyen
(74) Attorney, Agent, or Firm—McDermott, Will & Emery

(57) ABSTRACT

An extruded heat exchanger that reduces manufacturing costs and material waste, without compromising heat spreading effects. The heat exchanger has an upper surface that is thermally coupled to a heat sink. Two sidewalls extend only from opposite edges of the upper surface. A flange extends from each of the opposing sidewalls.

15 Claims, 7 Drawing Sheets

EXTRUDED HEAT SPREADER

RELATED APPLICATIONS

This application claims priority from U.S. Provisional Application Serial No. 60/214.785, filed Jun. 28, 2000, incorporated herein by reference.

BACKGROUND OF THE INVENTION

1. Field of the Invention

The present invention relates to the packaging of integrated circuits and, more particularly, to an extruded heat spreader that reduces manufacturing costs and material consumption, and a method for making the same.

2. Description of Related Art

Packages for integrated circuits tend to generate substantial heat. This heat needs to be dissipated in order to ensure the operability of the circuits. A common method of removing heat is to employ a heat spreader. The heat spreader draws heat from the heat generating portions of the package and spreads it over an upper portion of the spreader. The upper portion is thermally coupled to a heat sink, or some other apparatus for dissipating heat. Conventional heat spreaders are fabricated using a stamping method. The stamping method bends or presses the metal blank into the desired end shape.

One such conventional heat spreader 10 is shown in FIG. 1. Such a conventional heat spreader 10 has an upper portion 12 and sidewalls 14 that extend continuously from each edge of the upper portion 12. Two pairs of flanges 16 extend from opposing sidewalls 14 to form a single flange 16. The flange 16 also has an upwardly extending outer ridge 18 that occurs as a result of the stamping process. The conventional heat spreader is depicted in profile at FIG. 1a.

There are problems, however, with conventional heat spreaders. For example, in conventional heat spreaders, the flange extends continuously about the periphery of the heat spreader. Such a large flange, however, does not increase the ability of the heat spreader to spread heat over the spreader's upper surface for dissipation by the heat sink. The flanges therefore needlessly increase material consumption. Moreover, conventional heat spreaders are stamped, which requires that each individual heat spreader be formed one at a time. Thus, conventional heat spreaders tend to cause increased manufacturing costs as well as increased material consumption.

SUMMARY OF THE INVENTION

There is a need for a heat spreader, and a method for making the same, that can be produced more efficiently at a reduced manufacturing cost and with less material consumption, without reducing the effectiveness of the spreader.

These and other needs are met by embodiments of the present invention which provide an extruded heat spreader for a semiconductor device comprising an upper portion; first and second sidewalls only extending at respective first and second angles from opposite edges of the upper portion; and a pair of flanges extending at flange angles from the first and second sidewalls.

The extrusion process used to form the extruded heat spreader of the present invention reduces the amount of material needed to fabricate each heat spreader. Also, because there are only two sidewalls and two flanges, each heat spreader requires less material. As a result, manufacturing cost and material consumption are reduced.

The earlier stated needs are also met by another embodiment of the present invention which provides a method of fabricating a heat spreader for a semiconductor device, the method comprising providing a heat conducting material; extruding the material through a die; and cutting the extruded material into predetermined lengths to form a heat spreader having an upper portion; first and second sidewalls only extending at respective first and second angles from opposite edges of the upper portion; and a pair of flanges extending at flange angles from the first and second sidewalls.

Additional advantages and novel features of the invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

Preferred embodiments of the invention will be described with reference to the drawings, which are incorporated in and constitute a part of the specification, in which.

DETAILED DESCRIPTION OF THE PREFERRED EMBODIMENTS

A heat spreader according to the invention is fabricated using an extrusion method. In extrusion, solid metal is forced through an orifice having a desired shape with compressive forces. There are two basic types of extrusion—hot and cold. In hot extrusion, a heated billet of metal is placed in a chamber and compressed by a ram. At the opposite end of the chamber, there is a die having an orifice corresponding to the desired shape of the end product. The metal is emitted from the other side of the die in a continuous bar-like fashion having a cross-sectional shape that is the same as the die orifices.

Cold extrusion is essentially the same as hot extrusion, but the metal is not heated prior to being extruded through the die. There are advantages to cold extrusion, including higher strength due to severe strain-hardening, a good finish, very good dimensional accuracy, and economy due to fewer operations and a minimum number of moving parts.

As compared to stamping, extrusion is preferable because of the fewer number of moving parts, lower manufacturing cost, reduced material consumption, and increased workability.

Figure 1:
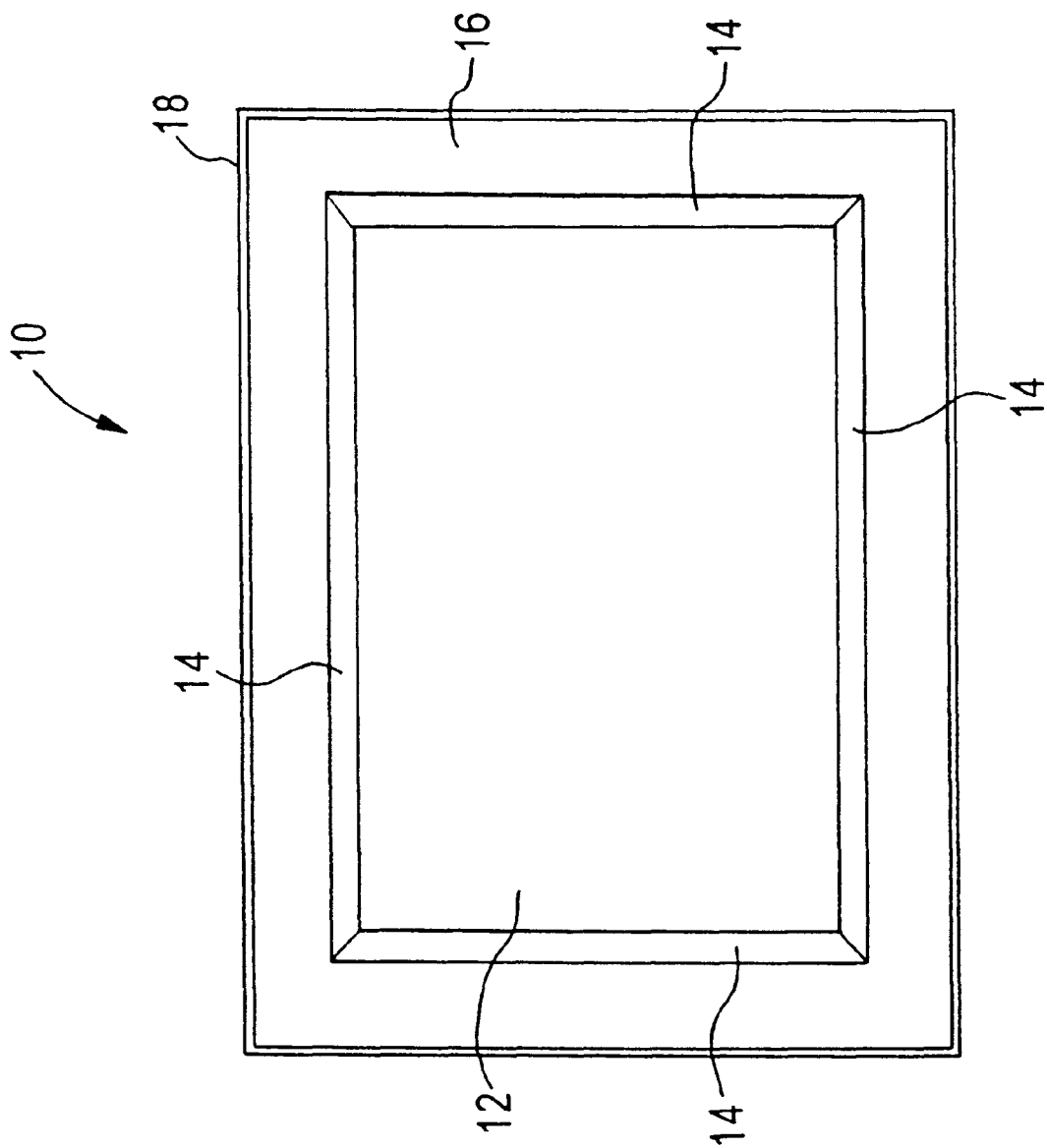
FIG. 1 is a top view of a conventional stamped heat spreader.
Figure 1A:
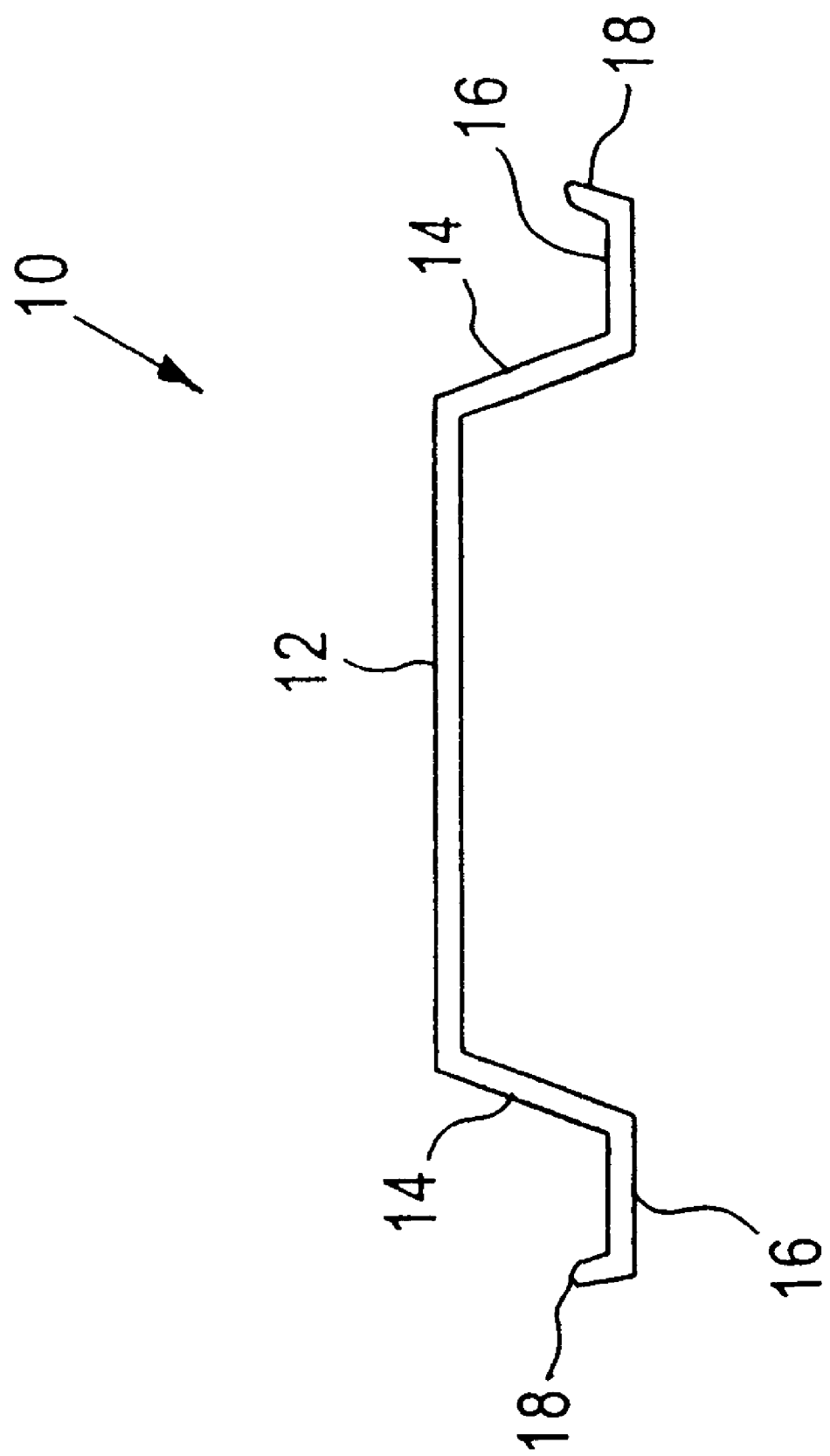
FIG. 1a is a side sectional view of the conventional heat spreader of FIG. 1.
Figure 2:
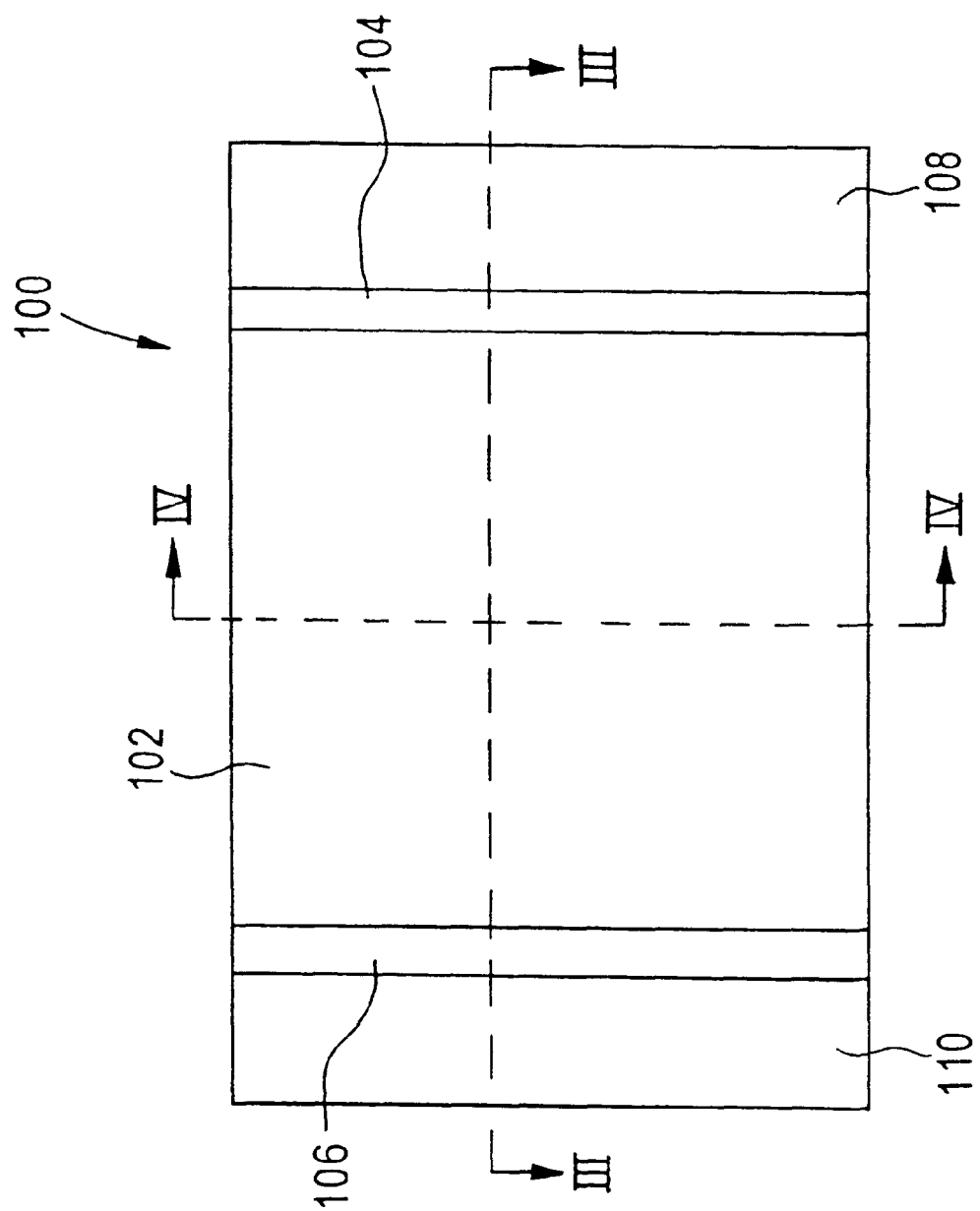
FIG. 2 is a top view of an embodiment of an extruded heat spreader according to the present invention.
Figure 3:
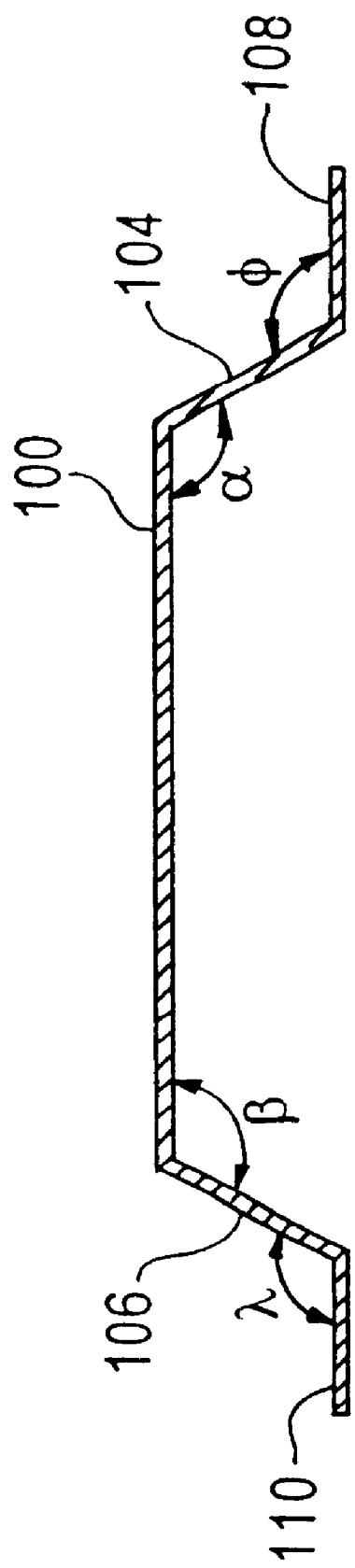
FIG. 3 is a side sectional view of the embodiment of the extruded heat spreader taken along line III—III of FIG. 2.

Referring now to the drawings, and initially, to FIGS. 2 and 3, there will be seen an embodiment of an extruded heat exchanger 100 according to the invention. The heat spreader 100 has an upper portion 102 and only two sidewalls, a first sidewall 104 and a second sidewall 106, which extend from opposite edges of the upper portion 102. The first and second sidewalls 104, 106 extend from the edges of the upper portion 102 at first and second angles α, β, respectively. The first and second angles are at least 10 degrees from the horizontal but no more than 90 degrees—preferably 70 degrees.

The preferred embodiment of the extruded heat spreader also has first and second flanges 108, 110 extending from the first and second sidewalls 104, 106, respectively. In this embodiment, the flanges 108, 110 extend at flange angles ϕ, λ which are between 90 and 180 degrees. It is preferable that the sum of the flange angles ϕ, λ and the respective first or second angle is 180 degrees. This is so, because it is preferable that each of the first and second flanges 108, 110 is parallel to the upper portion 102.

In the embodiment shown in FIGS. 2 and 3, there are only two sidewalls 104, 106 and two flanges 108, 110. As a result, less material is needed as compared to the stamped spreader of the prior art, which has four sidewalls and a single continuous flange. As a result, material costs are reduced with the present invention. The two sidewalls 104, 106 and two flanges 108, 110 result from the extrusion process, either hot or cold, in which a material is pressed through a die to form the general shape of the heat spreader and then cut into each individual heat spreader 100.

Figure 4:
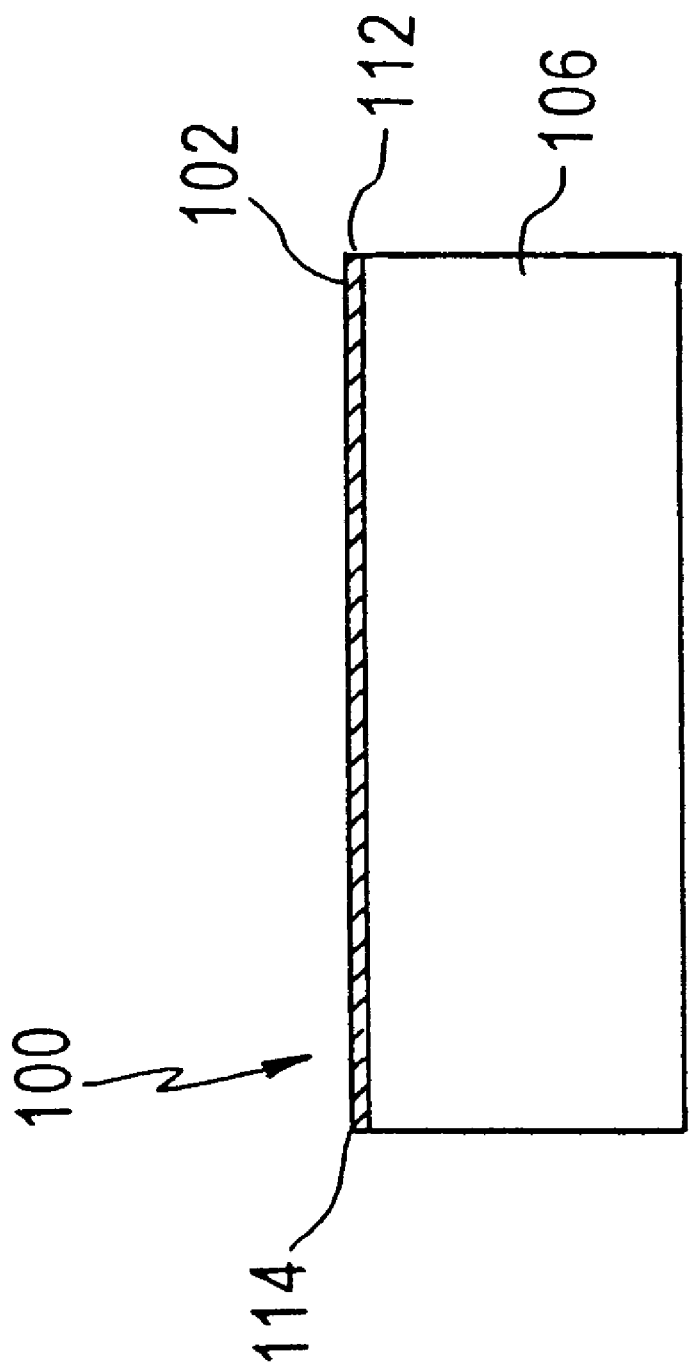
FIG. 4 is a side sectional view of the embodiment of the extruded heat spreader taken along line IV—IV of FIG. 2.

FIG. 4 is a side sectional view of the preferred heat spreader taken along the line IV—IV of FIG. 2. As shown in FIG. 4, on a pair of opposing sides of the spreader 100, there are no sidewalls. In other words, as shown in FIG. 4, only a single sidewall 106 extends from the rear of the upper portion 102. The upper portion 102 terminates at the lateral edges 112, 114 with nothing extending therefrom. In comparison to conventional heat spreaders, there is a reduction in material consumption of between 10 and 30 percent depending on the sizes of the upper portion 102, sidewalls 104, 106, and flanges 108, 110.

The heat spreader according to the preferred embodiment is preferably aluminum, because of its conductive properties, cost, workability, and strength. Other materials may be used, however, without departing from the invention.

Figure 5:
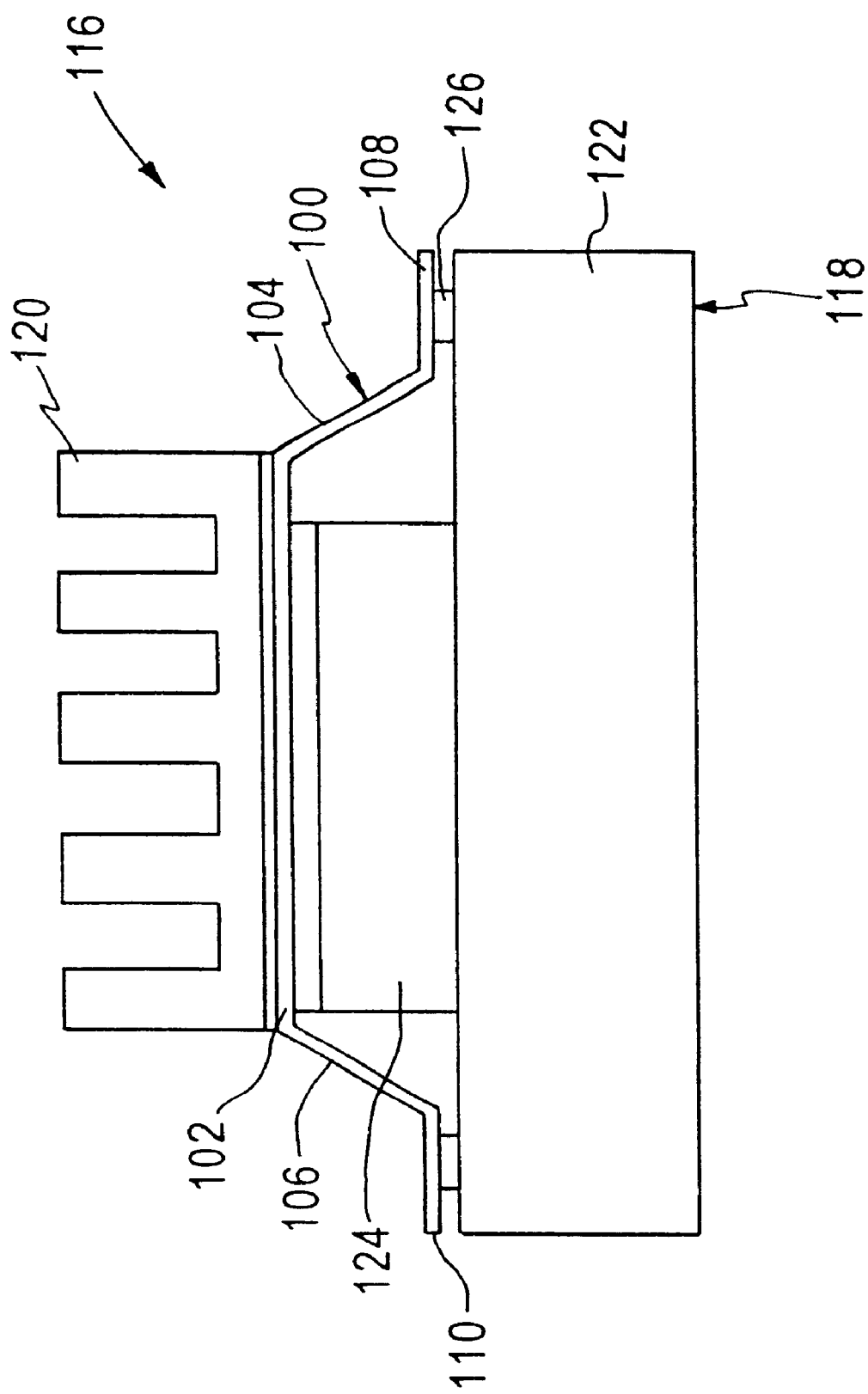
FIG. 5 is a side sectional view. of an integrated circuit device arrangement that includes the embodiment of the extruded heat spreader according to the invention.

FIG. 5 depicts an embodiment of an extruded heat spreader-package-heat sink assembly 116 according to the invention. The assembly 116 has an integrated circuit package assembly 118, an extruded heat spreader 100 and a heat sink 120. The integrated circuit package 118 has a package board 122 and an integrated circuit die 124 mounted thereto. The package board 122 has preprinted circuitry (not shown) to which the die 124 is mounted.

The extruded heat spreader 100 is mounted to the package board, preferably, with an adhesive 126. The heat spreader 100 has an upper portion 102 and only two sidewalls, first and second sidewalls 104, 106. First and second flanges 108, 110 extend from the first and second sidewalls 104, 106, respectively. The flanges 108, 110 are for mounting the extruded heat spreader 100 to the package board 122 with the adhesive 126.

As shown, a heat sink 120 is mounted to the upper portion 102 of the extruded heat spreader 100. The heat sink is preferably mounted in a thermally conductive manner to ensure that heat produced by the integrated circuit die 124 is dissipated to the ambient.

As the heat spreading function is performed substantially only by the upper portion 102, not the flanges 108, 110, the thermal coupling to the heat sink 120 is sufficient to spread and dissipate the heat as in conventional heat spreaders.

Figure 6:
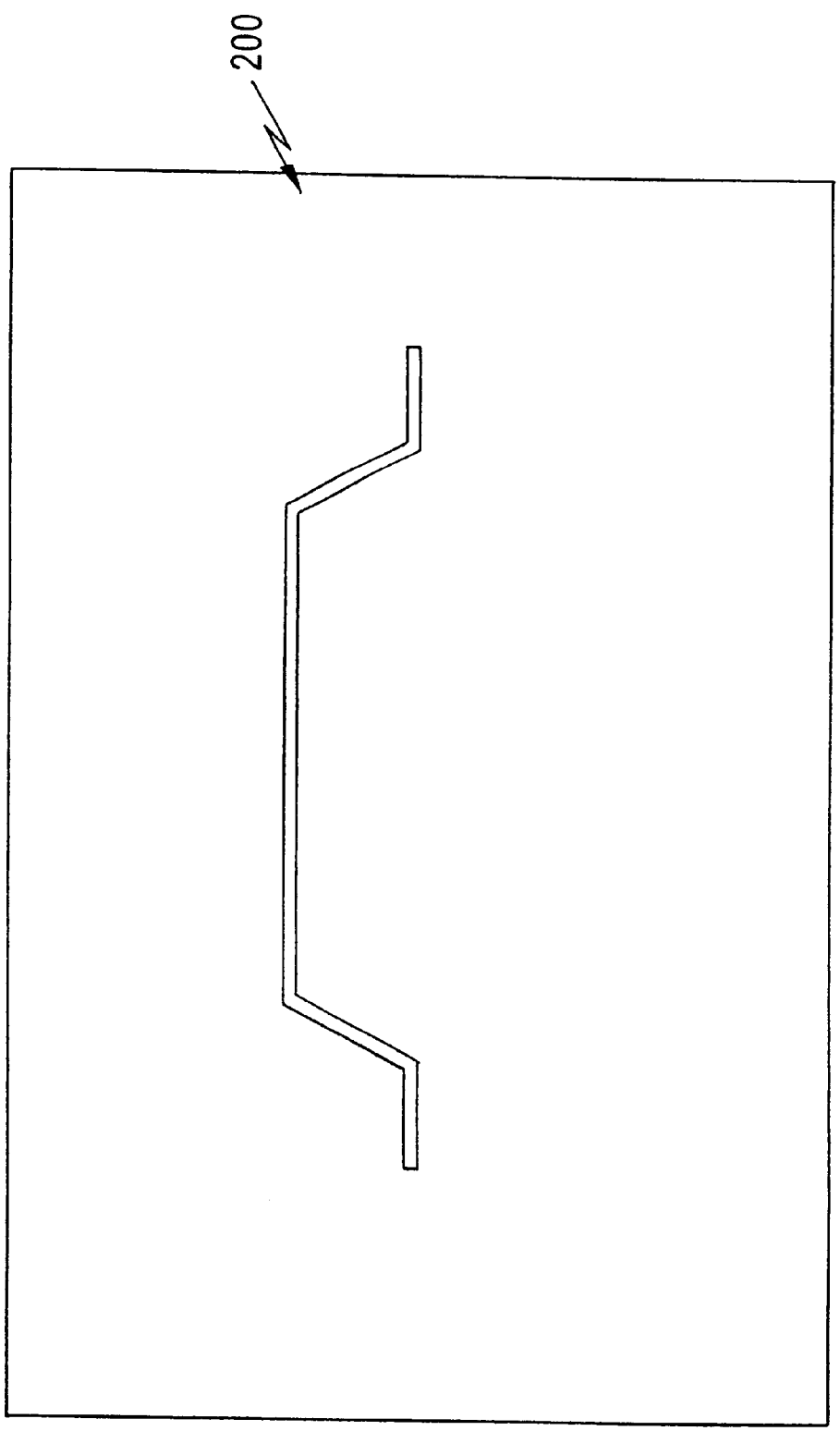
FIG. 6 is a front view of a die used in an extruder to make the embodiment of the heat spreader according to the invention.

FIG. 6 is a front view of the die 200 used for extruding a heat spreader according to the invention. In this extrusion process, a source of material is placed in the extruder and pressed through the die 200. Once the material has been pressed through the die (and cooled, if hot extrusion is used), the pressed metal is cut into the desired sizes for the heat spreader. It is possible to extrude the heat spreader in a number of different shapes and sizes.

The extrusion process used to form the extruded heat spreader of the present invention reduces the amount of material needed to fabricate each heat spreader. Also, because there are only two sidewalls and two flanges, each heat spreader requires less material. As a result, manufacturing cost and material consumption are reduced.

While this invention has been described in connection with what is presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. An extruded heat spreader for a semiconductor device comprising:

an upper portion;

first and second sidewalls only extending at respective first and second angles from opposite edges of the upper portion; and a pair of flanges, each flange extending at flange angle from a respective one the first and second sidewalls, wherein the first and second angles are each about 70°, and a sum of the first angle and the flange angle, and a sum of the second angle and the flange angle are each about 180°.

2. An extruded heat spreader as claimed in claim 1, wherein a portion of each of the flanges extends substantially parallel to the upper portion.

3. An extruded heat spreader for a semiconductor device comprising:

an upper portion;

first and second sidewalls only extending at respective first and second angles from opposite edges of the upper portion; and a pair of flanges, each flange extending at respective flange angle from a corresponding one the first and second sidewalls, wherein the first and second angles are not equal.

4. An extruded heat spreader as claimed in claim 1, wherein in the upper portion is a square.

5. An extruded heat spreader as claimed in claim 1, wherein the upper portion is a rectangle.

6. An extruded heat spreader as claimed in claim 5, wherein the first and second sidewalls extend from lengths of the rectangle.

7. An extruded heat spreader as claimed in claim 5, wherein the first and second sidewalls extend from widths of the rectangle.

8. An extruded heat spreader as claimed in claim 1, wherein the heat spreader includes aluminum.

9. An integrated circuit device arrangement comprising:
a package; and
an extruded heat spreader adhered to the package, the heat spreader including:
   an upper portion;
   first and second sidewalls only extending at respective first and second angles from opposite edges of the upper portion; and
   a pair of flanges, each flange extending at a flange angle from a respective one of the first and second sidewalls, wherein
      the first and second angles are each about 70°, and
      a sum of the first angle and the flange angle, and a sum of the second angle and the flange angle are each about 180°.

10. An integrated circuit device arrangement as claimed in claim 9, further comprising an adhesive for adhering the heat spreader to the package.

11. A semiconductor device as claimed in claim 10, further comprising a heat sink thermally coupled to the heat spreader.

12. A semiconductor device as claimed in claim 11, wherein the heat spreader comprises aluminum.

13. A method of fabricating a heat spreader for a semiconductor device, the method comprising:
providing a heat conducting material;
extruding the material through a die; and
cutting the extruded material into predetermined lengths to form a heat spreader having an upper portion, wherein
   the heat spreader is extruded as a single structure with an upper portion,
      first and second sidewalls, only extending at respective first and second angles from opposite edges of the upper portion, and
      a pair of flanges, each flange extending at a flange angle from a respective one of the first and second sidewalls,
   the first and second angles are each about 70°, and
   a sum of the first angle and the flange angle, and a sum of the second angle and the flange angle are each about 180°.

14. A method as claimed in claim 13, wherein the die has an orifice that has a flat upper portion, two sides only extending from the upper portion and bottom portions extending from each of the sides.

15. A method as claimed in claim 13, wherein the material is aluminum.

* * * * *